(12) United States Patent
Xu et al.

(10) Patent No.: US 12,556,195 B2
(45) Date of Patent: Feb. 17, 2026

(54) SUCCESSIVE APPROXIMATION REGISTER ANALOG-TO-DIGITAL CONVERTER AND COMPARISON METHOD

(71) Applicant: Chongqing GigaChip Technology Co., Ltd., Chongqing (CN)

(72) Inventors: Daiguo Xu, Chongqing (CN); Hequan Jiang, Chongqing (CN); Ruzhang Li, Chongqing (CN); Jianan Wang, Chongqing (CN); Dongbing Fu, Chongqing (CN); Guangbing Chen, Chongqing (CN); Zhou Yu, Chongqing (CN); Zhengping Zhang, Chongqing (CN); Can Zhu, Chongqing (CN); Weiqi Gao, Chongqing (CN)

(73) Assignee: Chongqing GigaChip Technology Co., Ltd., Chongqing (CN)

( * ) Notice: Subject to any disclaimer, the term of this patent is extended or adjusted under 35 U.S.C. 154(b) by 127 days.

(21) Appl. No.: 18/663,059

(22) Filed: May 13, 2024

(65) Prior Publication Data
US 2024/0297660 A1    Sep. 5, 2024

Related U.S. Application Data

(63) Continuation of application No. PCT/CN2021/143490, filed on Dec. 31, 2021.

(30) Foreign Application Priority Data

Dec. 22, 2021   (CN) .......................... 202111583379.X

(51) Int. Cl.
H03M 1/44    (2006.01)
H03M 1/46    (2006.01)

(52) U.S. Cl.
CPC ............. *H03M 1/442* (2013.01); *H03M 1/46* (2013.01); *H03M 1/468* (2013.01)

(58) Field of Classification Search
CPC ......... H03M 1/442; H03M 1/468; H03M 1/46
(Continued)

(56) References Cited

U.S. PATENT DOCUMENTS

| 10,917,105 B1 | 2/2021 | Ayman et al. |
| 10,938,401 B1* | 3/2021 | Olieman ............... H03M 1/462 |
| 10,985,771 B2* | 4/2021 | Fan ..................... H03M 1/0678 |

FOREIGN PATENT DOCUMENTS

| CN | 105375925 A | 3/2016 |
| CN | 106301364 A | 1/2017 |

(Continued)

*Primary Examiner* — Khai M Nguyen

(57) ABSTRACT

A comparison method includes: providing a successive approximation register analog-to-digital converter, where the successive approximation register analog-to-digital converter includes n−1 weighted capacitors, a charge transfer capacitor, and a comparator; sampling an differential input signal by using the first weighted capacitor and the charge transfer capacitor; importing the differential input signal stored on the charge transfer capacitor, where the differential input signal is transferred and redistributed on the charge transfer capacitor and n−2 other weighted capacitors than the first weighted capacitor, and completing the first time of comparison; and importing the differential input signal stored on the first weighted capacitor and the differential input signal stored on the charge transfer capacitor, importing a reference voltage by using the second to jth weighted capacitors, where the differential input signal and the reference voltage are transferred and redistributed on a capacitor array, and completing a jth time of comparison.

10 Claims, 7 Drawing Sheets

(58) Field of Classification Search
USPC .................................. 341/155, 161, 163, 172
See application file for complete search history.

(56) References Cited

FOREIGN PATENT DOCUMENTS

| | | |
|---|---|---|
| CN | 110071723 A | 7/2019 |
| CN | 113328752 A | 8/2021 |

* cited by examiner

Prior Art FIG. 1

SUCCESSIVE APPROXIMATION REGISTER ANALOG-TO-DIGITAL CONVERTER AND COMPARISON METHOD

CROSS REFERENCE TO RELATED APPLICATION

The present application is a continuation application of PCT Application No. PCT/CN2021/143490, filed on Dec. 31, 2021, which claims the benefit of priority to a Chinese Patent Application number CN202111583379.X, filed on Dec. 22, 2021, the disclosure of the above application is hereby incorporated by reference in its entirety for all purposes.

TECHNICAL FIELD

The present disclosure relates to the field of integrated circuit technologies, and in particular, to a successive approximation register analog-to-digital converter and a comparison method.

BACKGROUND

In recent years, with continuous development of industrial control technologies, a requirement for a high-precision analog-to-digital converter (ADC) is increasingly high. In an industrial field in which high-precision control is required, a requirement for precision of the ADC has been raised to 18 bits, and reduced power consumption is further required. In the industrial control field, because a successive approximation register analog-to-digital converter (SAR ADC) has advantages such as low power consumption, digital process compatibility, and a simple structure, the SAR ADC is still a main structure of an ADC with 16 bits or more bits. In a conventional SAR ADC structure, a capacitor array is also used as a sampling capacitor. An advantage of this structure is that no additional sampling capacitor is required, thereby reducing a chip area. However, a disadvantage thereof is that a plurality of weighted capacitors perform sampling at the same time, and voltages that are actually sampled by the weighted capacitors are different. Consequently, sampling precision is reduced, and performance of the entire SAR ADC is directly degraded. As a frequency of an input signal increases, this performance degradation is increasingly obvious. Therefore, problems of the SAR ADC with the conventional structure are as follows: (1) The sampling network is a multi-capacitor network, and parasitic resistors and capacitors are different on capacitor sampling paths. As a result, bandwidth mismatch occurs on each sampling capacitor path. (2) To ensure reliability of a comparator, a maximum amplitude of an differential input signal is twice a supply-ground voltage difference of the comparator. This improves a noise requirement on the comparator.

SUMMARY

The present disclosure provides a successive approximation register analog-to-digital converter and a comparison method, to resolve problems of bandwidth mismatch and a high noise requirement on a comparator of a successive approximation register analog-to-digital converter in the conventional technology.

The present disclosure provides a successive approximation register analog-to-digital converter, including:

a comparator;

a capacitor array, including a first capacitor array and a second capacitor array, where the first capacitor array and the second capacitor array each include n−1 weighted capacitors and a charge transfer capacitor, a first plate of the first capacitor array is connected to an in-phase input terminal of the comparator, a first plate of the second capacitor array is connected to an inverting input terminal of the comparator, n is an integer greater than or equal to 3, the n−1 weighted capacitors are successively arranged in descending order of capacitance, the first weighted capacitor has largest capacitance, and the last weighted capacitor has smallest capacitance;

a switch, including a first channel switch, a second channel switch, a third channel switch, a first switch, a second switch, a third switch, a fourth switch, a fifth switch, a sixth switch, a first switch array, and a second switch array, where a first common-mode voltage is connected to the in-phase input terminal of the comparator after passing through the first channel switch connected in series, the first common-mode voltage is connected to the inverting input terminal of the comparator after passing through the second channel switch connected in series, the third channel switch is connected in series between the in-phase input terminal of the comparator and the inverting input terminal of the comparator, a second plate of the first weighted capacitor in the first capacitor array is further connected to a first output terminal of an differential input signal via the first switch connected in series, a second plate of the first weighted capacitor in the second capacitor array is further connected to a second output terminal of the differential input signal via the second switch connected in series, a second plate of the charge transfer capacitor in the first capacitor array is further connected to the first output terminal of the differential input signal via the third switch connected in series, a second plate of the charge transfer capacitor in the second capacitor array is further connected to the second output terminal of the differential input signal via the fourth switch connected in series, the second plate of the first weighted capacitor in the capacitor array is connected to a second common-mode voltage by using the fifth switch, the second plate of the charge transfer capacitor in the capacitor array is connected to the second common-mode voltage by using the sixth switch, a second plate of the last weighted capacitor in the capacitor array is grounded, a second plate of the mth weighted capacitor in the capacitor array is connected to the second common-mode voltage by using a corresponding switch in the first switch array, the second plate of the mth weighted capacitor in the capacitor array is further connected to a reference voltage by using a corresponding switch in the second switch array, and m=2, 3, . . . , n−2; and a logic control module, where an input terminal of the logic control module is connected to an output terminal of the comparator, an output terminal of the logic control module is connected to the second switch array, each switch in the second switch array is controlled based on an output signal of the comparator, so that the mth weighted capacitor is successively accumulated and imported to the reference voltage, so as to perform successive approximation conversion, and successive approximation comparison is performed based on the comparator, so as to implement analog-to-digital conversion.

In exemplary embodiments, capacitance of the charge transfer capacitor is less than capacitance of the last weighted capacitor.

In exemplary embodiments, the capacitor array further includes: a redundant-bit capacitor array, where a second plate of the redundant-bit capacitor array in the capacitor array is connected to the second common-mode voltage by using a corresponding switch in the first switch array, and the second plate of the redundant-bit capacitor array in the capacitor array is further connected to the reference voltage by using a corresponding switch in the second switch array.

In exemplary embodiments, weight values of the weighted capacitors from a most significant bit to a least significant bit are respectively $2^{n-2}C, 2^{n-3}C, \ldots, 2C, C$.

In exemplary embodiments, when the converter is in a sampling state, the first channel switch, the second channel switch, the third channel switch, the first switch, the second switch, the third switch, and the fourth switch are turned on, the first switch array is controlled to connect the second plate of the mth weighted capacitor in the capacitor array to the second common-mode voltage, and the first weighted capacitor and the charge transfer capacitor sample the differential input signal.

In exemplary embodiments, after sampling ends, the first weighted capacitor is controlled to be in a disconnected state, the sixth switch is turned on, the first switch array is controlled to connect the second plate of the mth weighted capacitor in the capacitor array to the second common-mode voltage, the differential input signal stored on the charge transfer capacitor is transferred and redistributed on n−2 other weighted capacitors and the charge transfer capacitor, to reduce an amplitude of the differential input signal, and the reduced differential input signal is received and the first time of comparison is completed by using the comparator, to obtain polarity of the differential input signal, and output a most significant bit of digital code.

In exemplary embodiments, after the first time of comparison ends, the fifth switch and the sixth switch are turned on, the first switch array is controlled to connect the second plate of the mth weighted capacitor in the capacitor array to the second common-mode voltage, the differential input signal stored on the first weighted capacitor and the differential input signal stored on the charge transfer capacitor are imported, the second switch array is controlled by using the logic control module, so that n−3 other weighted capacitors are successively accumulated and imported to the reference voltage, so as to perform successive approximation conversion, and after n−3 times of comparison, n−3 bits of output codes of the successive approximation register analog-to-digital converter are successively obtained, to complete a comparison process.

To achieve the foregoing and other related objectives, the present disclosure further provides a comparison method for a successive approximation register analog-to-digital converter, including:

providing a successive approximation register analog-to-digital converter, where the successive approximation register analog-to-digital converter includes a capacitor array and a comparator, the capacitor array includes at least n−1 weighted capacitors and a charge transfer capacitor, n is an integer greater than or equal to 3, the n−1 weighted capacitors are successively arranged in descending order of capacitance, the first weighted capacitor has largest capacitance, and the last weighted capacitor has smallest capacitance;

sampling an differential input signal by using the first weighted capacitor and the charge transfer capacitor;

importing the differential input signal stored on the charge transfer capacitor, where the differential input signal is transferred and redistributed on the charge transfer capacitor and n−2 other weighted capacitors than the first weighted capacitor, to form a first differential signal, and receiving the first differential signal and completing the first time of comparison by using the comparator, to obtain polarity of the differential input signal, and output a most significant bit of digital code; and importing the differential input signal stored on the first weighted capacitor and the differential input signal stored on the charge transfer capacitor, importing a reference voltage by using the second to jth weighted capacitors, where the differential input signal and the reference voltage are transferred and redistributed on the capacitor array to form a jth differential signal, and receiving the jth differential signal and completing a jth time of comparison by using the comparator, to output a corresponding digital code, where j is an integer from 2 to n−2.

In exemplary embodiments, capacitance of the charge transfer capacitor is less than capacitance of the last weighted capacitor.

In exemplary embodiments, the capacitor array further includes a redundant-bit capacitor array, and the comparison method for a successive approximation register analog-to-digital converter further includes:

in a jth comparison process, introducing a reference voltage by using the redundant-bit capacitor array, to correct the jth differential signal.

Beneficial effects of exemplary embodiments of the present disclosure are as follows: According to the successive approximation register analog-to-digital converter in the present disclosure, the charge transfer capacitor is introduced, to substantially reduce the differential input signal. During the first time of comparison, polarity of the differential input signal is directly compared, so that the amplitude of the differential input signal can be greater than twice a supply-ground voltage difference of the comparator. Therefore, a noise requirement on the comparator is reduced without affecting reliability of the comparator, thereby increasing a signal-to-noise ratio of the successive approximation register analog-to-digital converter. Sampling is performed by using the first weighted capacitor and the charge transfer capacitor, so that the capacitor array can approximate to a single-capacitor sampling network, thereby eliminating a problem of bandwidth mismatch, in the sampling network, caused by a plurality of capacitors and a plurality of sampling paths in a conventional-structure successive approximation register analog-to-digital converter. Therefore, sampling precision of the successive approximation register analog-to-digital converter is significantly improved, so that performance of the entire successive approximation register analog-to-digital converter is significantly improved.

DESCRIPTION OF EMBODIMENTS

As mentioned in the Background, a conventional-structure SAR ADC has problems such as bandwidth mismatch and a high noise requirement on a comparator. To describe these two problems in more detail, working principles, advantages, and disadvantages of the conventional-structure SAR ADC are analyzed by using the conventional-structure SAR ADC as an example.

Figure 1:
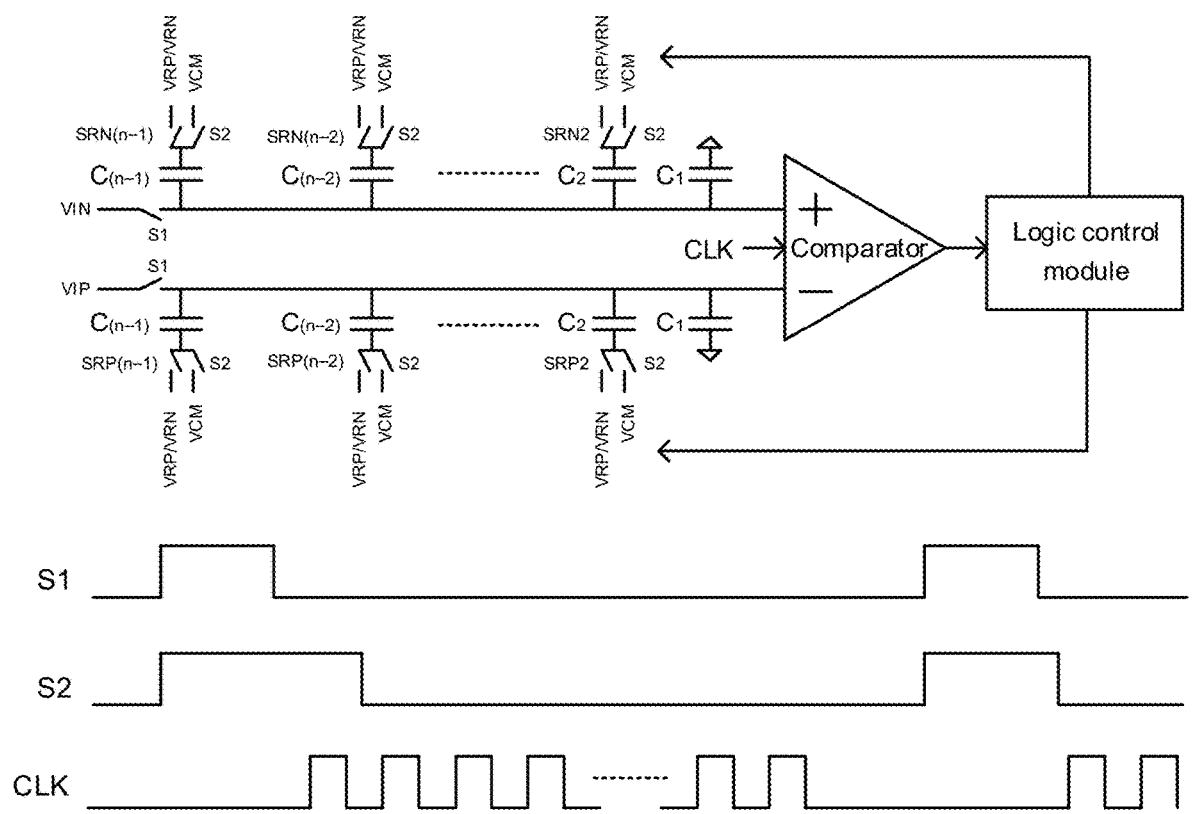
FIG. 1 is a schematic diagram and a timing diagram of a conventional-structure SAR ADC in prior art.

FIG. 1 is a schematic diagram and a timing diagram of a conventional-structure successive approximation register analog-to-digital converter. As shown in FIG. 1, when the SAR ADC is in a sampling state, a switch S1 and a switch S2 are turned on, one plate of a sampling capacitor array is connected to input signals VIP and VIN, and is also connected to an input terminal of a comparator. The other plate of the sampling capacitor array is connected to a common-mode voltage VCM. In this case, the sampling capacitor array tracks the input signals. When the SAR ADC completes sampling, the switch S1 is first turned off, and the comparator performs comparison for the first time. Subsequently, the switch S2 is turned off, and the other plate of the capacitor array is separately successively connected to a positive reference voltage VRP or a negative reference voltage VRN by using switch arrays SRN(n−1)/SRP (n−1), . . . , SRN2/SRP2 based on an output result of the comparator until one successive approximation process is completed. An advantage of this structure is that a circuit and timing are simple. However, because on-resistance of the switch S1 needs to be reduced as a sampling frequency increases, an area of the switch S1 increases as the sampling frequency increases. Consequently, serious charge injection and clock feedthrough occur in the switch S1. This affects sampling precision of the SAR ADC, and affects overall performance of the SAR ADC. In conclusion, the conventional-structure SAR ADC has the following problems: (1) A sampling network is a multi-capacitor network, and parasitic resistors and capacitors are different on capacitor sampling paths. As a result, bandwidth mismatch occurs on each sampling capacitor path. (2) To ensure reliability of the comparator, a maximum amplitude of an differential input signal is twice a supply-ground voltage difference of the comparator. This raises a noise requirement on the comparator.

Figure 2:
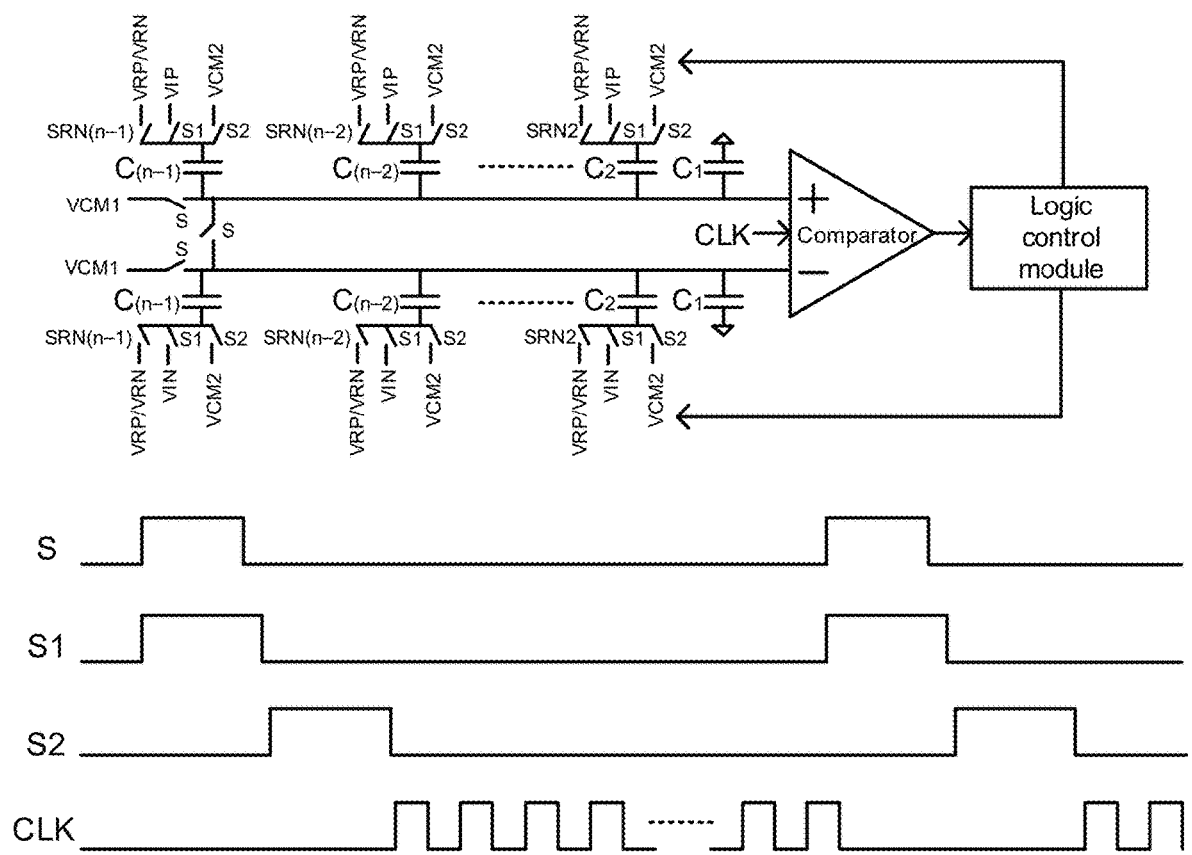
FIG. 2 is a schematic diagram and a timing diagram of an improved-structure SAR ADC.
Figure 3:
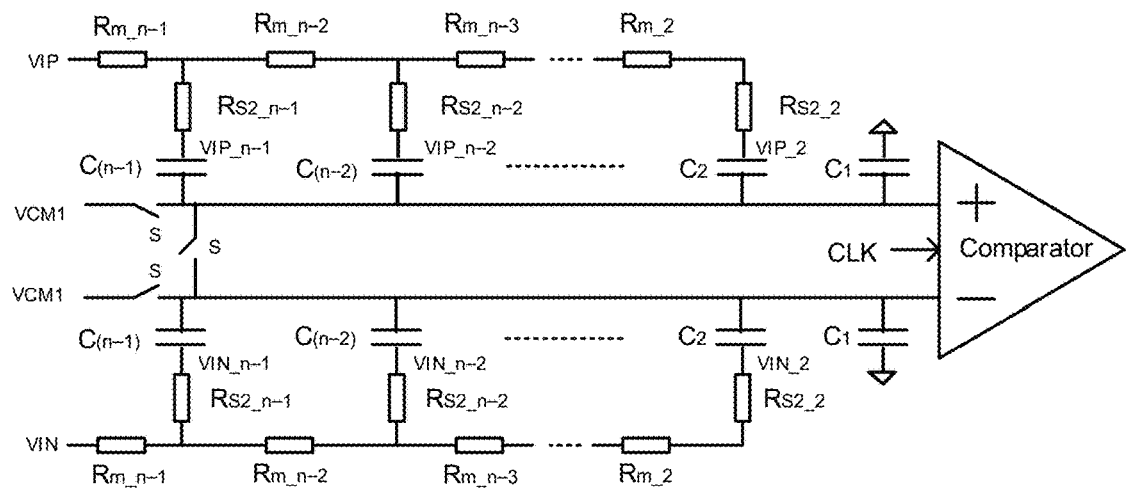
FIG. 3 is an equivalent schematic diagram of sampling of an improved-structure SAR ADC.

Based on the foregoing problems, a new sampling structure is proposed. FIG. 2 is a schematic diagram and a timing diagram of an improved-structure SAR ADC. One plate of a sampling capacitor array is connected to a common-mode voltage VCM1 by using a switch S, and is also connected to a differential input terminal of a comparator COMP. The other plate of the sampling capacitor array is connected to differential input signals VIP and VIN by using a switch S1, is connected to a common-mode voltage VCM2 by using a switch S2, and is connected to a positive reference voltage VRP or a negative reference voltage VRN by using switch arrays SRN(n−1)/SRP (n−1), . . . , SRN2/SRP2. When the SAR ADC is in a sampling state, the switches S and S1 are turned on, and the sampling capacitor array samples the input signals VIP and VIN. After sampling is completed, the switch S is first turned off. Because the switch S is connected to the common-mode voltage VCM1, an error caused by charge injection and clock feedthrough that are generated when the switch S is turned off is a common-mode error, which does not affect a differential sampling result, and therefore does not affect overall performance of the SAR ADC. This structure is also a common structure currently used for the SAR ADC. However, this structure also has an obvious problem, which is described below. Because the switch S1 used by weighted capacitors C(n−1), . . . , C2 in the capacitor array to be connected to the input signals is an independent switch, in a sampling process, it is equivalent to that a plurality of capacitors sample the input signals. FIG. 3 is an equivalent schematic diagram of sampling of an improved SAR ADC. A sampling switch network may be equivalent to a resistor network including resistors Rm_n−1, . . . , Rm_2 and resistors Rs2_n−1, . . . , Rs2_2. Therefore, voltages actually sampled by the sampling plates of the sampling capacitor array are respectively VIP_n−1/VIN_n−1, . . . , VIP_2/VIN_2. This indicates that voltages actually sampled by the weighted capacitors in the sampling capacitor array are different. This error may be equivalent to bandwidth mismatch. When a frequency of an output signal is low, the difference between the actually sampled voltages caused by the foregoing problem is not obvious. However, as a frequency of the input signal increases, the difference between the voltages actually sampled by the weighted capacitors is more obvious. An increase in a sampling error caused by the foregoing bandwidth mismatch severely affects overall performance of the SAR ADC. The foregoing problem is also a performance bottleneck currently encountered by the SAR ADC. As a result, performance of the SAR ADC is significantly degraded in case of high-frequency input. If sampling is performed by using one or several bits of weighted capacitors, a problem of bandwidth mismatch of the sampling network may be suppressed. However, after charge transfer, an amplitude of the actually sampled voltage is reduced. As a result, a higher noise requirement is imposed on the comparator.

Therefore, the inventor proposes a new concept: a successive approximation register analog-to-digital converter is provided, a charge transfer capacitor is introduced, to substantially reduce an differential input signal. During the first time of comparison, polarity of the differential input signal is directly compared, so that an amplitude of the differential input signal can be greater than twice a supply-ground voltage difference of a comparator. Therefore, a noise requirement on the comparator is reduced without affecting reliability of the comparator, thereby increasing a signal-to-noise ratio of the successive approximation register analog-to-digital converter. Sampling is performed by using the first weighted capacitor and the charge transfer capacitor, so that a capacitor array can approximate to a single-capacitor sampling network, thereby eliminating a problem of bandwidth mismatch, in the sampling network, caused by a plurality of capacitors and a plurality of sampling paths in a conventional-structure successive approximation register analog-to-digital converter. Therefore, sampling precision of the successive approximation register analog-to-digital converter is significantly improved, so that performance of the entire successive approximation register analog-to-digital converter is significantly improved.

In an embodiment, the present disclosure provides a successive approximation register analog-to-digital converter, the converter includes: a comparator; and a capacitor array, including a first capacitor array and a second capacitor array, where the first capacitor array and the second capacitor array each include n−1 weighted capacitors and a charge transfer capacitor, a first plate of the first capacitor array is connected to an in-phase input terminal of the comparator, a first plate of the second capacitor array is connected to an inverting input terminal of the comparator, and the n−1 weighted capacitors are successively arranged in descending order of capacitance. When the converter is in a sampling state, the first weighted capacitor and the charge transfer capacitor sample an differential input signal. After sampling ends, the first weighted capacitor is controlled to be in a disconnected state, the differential input signal stored on the charge transfer capacitor is transferred and redistributed on n−2 other weighted capacitors and the charge transfer capacitor, to reduce an amplitude of the differential input signal, and the reduced differential input signal is received and the first time of comparison is completed by using the comparator, to obtain polarity of the differential input signal, and output a most significant (highest) bit of digital code.

In exemplary embodiments, capacitance of the charge transfer capacitor is less than capacitance of the least significant (lowest) bit of weighted capacitor. In exemplary embodiments, the capacitor array further includes a redundant-bit capacitor array. In exemplary embodiments, weight values of the weighted capacitors from a most significant bit to a least significant bit are respectively $2^{n-2}C$, $2^{n-3}C$, ..., $2C$, $C$.

The following describes some implementations of the present disclosure by using some specific examples. A person skilled in the art can easily understand other advantages and effects of the present disclosure based on the content disclosed in this specification. The present disclosure may be further implemented or applied in other different specific implementations. Various details in this specification may also be modified or altered based on different viewpoints and applications without departing from the present disclosure. It should be noted that the following embodiments and features in the embodiments may be mutually combined when there are no conflicts.

References are made to FIG. 4 to FIG. 11. It should be noted that, the illustrations provided in some embodiments merely describe the basic concept of the present disclosure by using examples. Although the drawings show only components related to the present disclosure, and are not drawn based on a quantity of components, a shape of a component, and a size of a component during actual implementation, a shape, a quantity, and a scale of the components may be arbitrarily changed during actual implementation, and a component layout form may be more complex. The structure, scale, size, and the like shown in the accompanying drawings of this specification are merely used to cooperate with the content disclosed in the specification for understanding and reading by a person skilled in the art, and are not restrictions for limiting implementation of the present disclosure, and therefore have no technically substantial significance. Any modification of the structure, change of a proportional relationship or adjustment of the size shall still fall within the scope that can be covered by the technical content disclosed in the present disclosure, provided that they do not affect the effects that can be generated by the present disclosure and the purpose that can be achieved by the present disclosure.

For a thorough understanding of the present disclosure, detailed steps and detailed structures are proposed in the following descriptions to describe the technical solutions proposed in the present disclosure. A preferred embodiment of the present disclosure is described in detail as follows. However, in addition to these detailed descriptions, the present disclosure may have another implementation.

Figure 4:
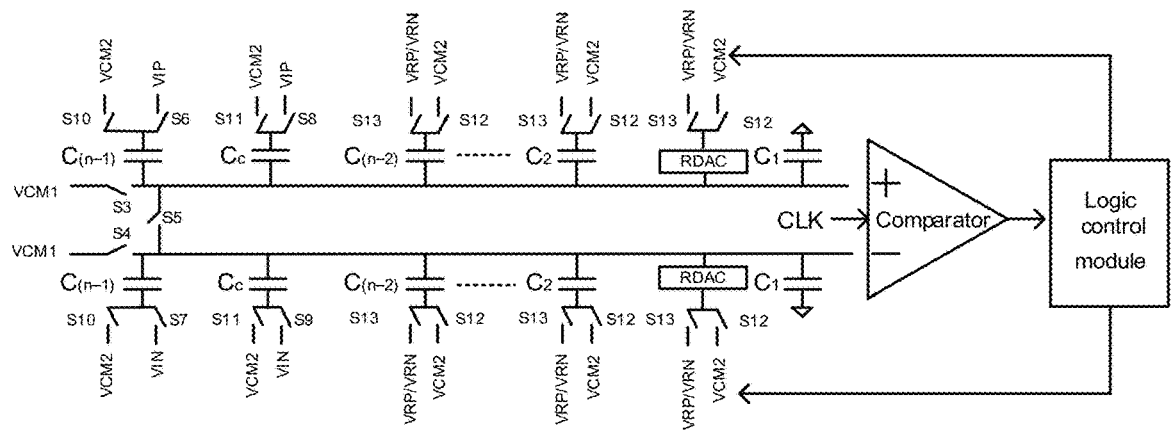
FIG. 4 is a schematic diagram of a capacitor array technology of a successive approximation register analog-to-digital converter according to an embodiment of the present disclosure.

Referring to FIG. 4, a successive approximation register analog-to-digital converter includes: a comparator, where an input terminal of the comparator is connected to a control signal CLK; a capacitor array, including a first capacitor array, a second capacitor array, and a redundant-bit capacitor array RDAC, where the first capacitor array and the second capacitor array each include n−1 weighted capacitors (C1, C2, ..., C(n−1)) and a charge transfer capacitor Cc, a first plate of the first capacitor array is connected to an in-phase input terminal (+) of the comparator, a first plate of the second capacitor array is connected to an inverting input terminal (−) of the comparator, n is an integer greater than or equal to 3, the n−1 weighted capacitors are successively arranged in descending order of capacitance, the first weighted capacitor C(n−1) has largest capacitance, and the last weighted capacitor C1 has smallest capacitance; a switch, including a first channel switch S3, a second channel switch S4, a third channel switch S5, a first switch S6, a second switch S7, a third switch S8, a fourth switch S9, a fifth switch S10, a sixth switch S11, a first switch array S12, and a second switch array S13, where a first common-mode voltage VCM1 is connected to the in-phase input terminal (+) of the comparator after passing through the first channel switch S3 connected in series, the first common-mode voltage VCM1 is connected to the inverting input terminal (−) of the comparator after passing through the second channel switch S4 connected in series, the third channel switch S5 is connected in series between the in-phase input terminal (+) of the comparator and the inverting input terminal (−) of the comparator, a second plate of the first weighted capacitor C(n−1) in the first capacitor array is further connected to a first output terminal VIP of an differential input signal via the first switch S6 connected in series, a second plate of the first weighted capacitor C(n−1) in the second capacitor array is further connected to a second output terminal VIN of the differential input signal via the second switch S7 connected in series, a second plate of the charge transfer capacitor Cc in the first capacitor array is further connected to the first output terminal VIP of the differential input signal via the third switch S8 connected in series, a second plate of the charge transfer capacitor Cc in the second capacitor array is further connected to the second output terminal VIN of the differential input signal via the fourth switch S9 connected in series, the second plate of the first weighted capacitor C(n−1) in the capacitor array is connected to a second common-mode voltage VCM2 by using the fifth switch S10, the second plate of the charge transfer capacitor Cc in the capacitor array is connected to the second common-mode voltage VCM2 by using the sixth switch S11, a second plate of the last weighted capacitor C1 in the capacitor array is grounded, a second plate of an mth weighted capacitor (C2, C3, . . . , C(n−2)) in the capacitor array is connected to the second common-mode voltage VCM2 by using a corresponding switch in the first switch array S12, a second plate of the redundant-bit capacitor array RDAC is connected to the second common-mode voltage VCM2 by using a corresponding switch in the first switch array S12, the second plate of the mth weighted capacitor in the capacitor array is further connected to a reference voltage VRP/VRN by using a corresponding switch in the second switch array S13, the second plate of the redundant-bit capacitor array RDAC in the capacitor array is connected to the reference voltage VRP/VRN by using a corresponding switch in the second switch array S13, and m=2, 3, . . . , n−2; and a logic control module, where an input terminal of the logic control module is connected to an output terminal of the comparator, an output terminal of the logic control module is connected to the second switch array S13, each switch in the second switch array S13 is controlled based on an output signal of the comparator, so that the mth weighted capacitor and the redundant-bit capacitor array RDAC are successively accumulated and imported to the reference voltage, so as to perform successive approximation conversion, and successive approximation comparison is performed based on the comparator, so as to implement analog-to-digital conversion. In an embodiment, capacitance of the charge transfer capacitor Cc is less than capacitance of the last weighted capacitor C1.

Figure 5:
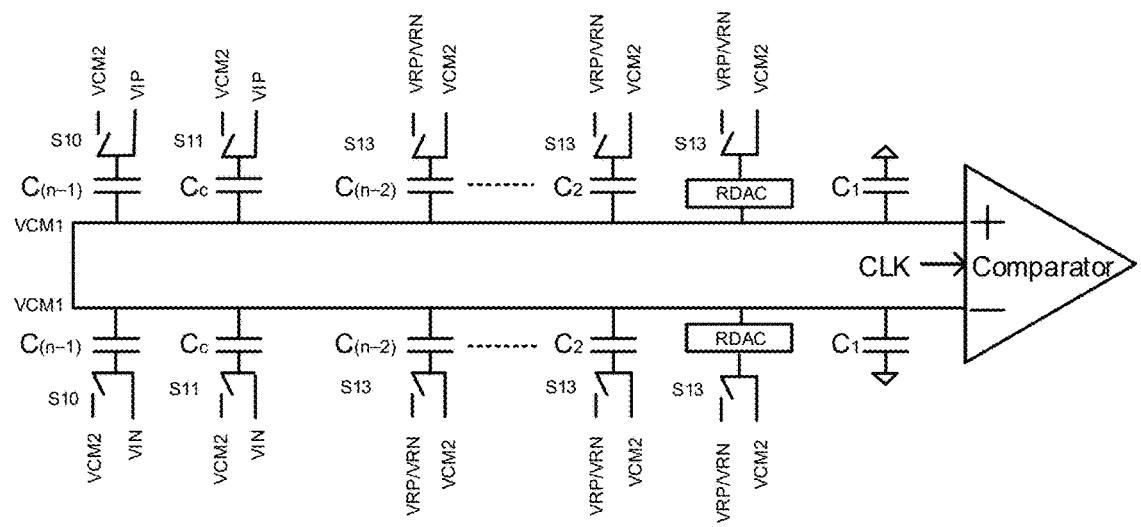
FIG. 5 is a schematic diagram of a sampling state according to an embodiment of the present disclosure.
Figure 6:
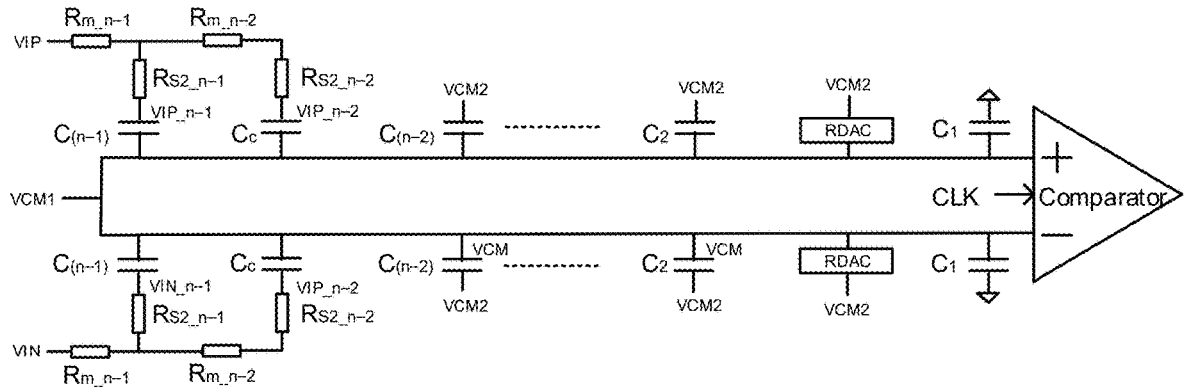
FIG. 6 is an equivalent schematic diagram in a sampling state according to an embodiment of the present disclosure.

Referring to FIG. 5 and FIG. 6, FIG. 5 is a schematic diagram of a sampling state. When the successive approximation register analog-to-digital converter in FIG. 4 is in a sampling state, the first channel switch S3, the second channel switch S4, the third channel switch S5, the first switch S6, the second switch S7, the third switch S8, and the fourth switch S9 are turned on, the first switch array S12 is controlled to connect the second plate of the mth weighted capacitor in the capacitor array to the second common-mode voltage VCM2, and the first weighted capacitor C(n−1) and the charge transfer capacitor Cc sample the differential input signals VIP and VIN. In this case, an equivalent circuit of sampling is shown in FIG. 6. Voltages actually sampled by the second plate of the capacitor C(n−1) are VIP_n−1 and VIN_n−1 respectively, and voltages actually sampled by the second plate of the capacitor Cc are VIP_n−2 and VIN_n−2 respectively. Because the capacitance of Cc is set to be very small (less than that of the last weighted capacitor C1), an actual differential sampled voltage may be approximately (VIP_n−1)−(VIN_n−1). This eliminates a problem of bandwidth mismatch caused by different weighted capacitors in a conventional structure.

Figure 7:
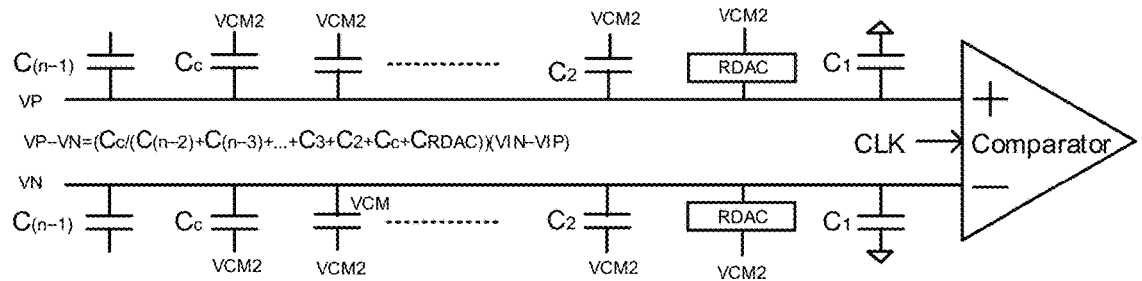
FIG. 7 is an equivalent schematic diagram in a charge transfer state according to an embodiment of the present disclosure.

FIG. 7 is an equivalent schematic diagram in a charge transfer state. After sampling ends, when the successive approximation register analog-to-digital converter in FIG. 4 is in a charge transfer state, the first weighted capacitor C(n−1) is controlled to be in a disconnected state, the sixth switch S11 is turned on, the first switch array S12 is controlled to connect the second plate of the mth weighted capacitor in the capacitor array to the second common-mode voltage VCM2, the differential input signal stored on the charge transfer capacitor Cc is transferred and redistributed on n−2 other weighted capacitors (C1, C2, . . . , C(n−2)), the redundant-bit capacitor array RDAC, and the charge transfer capacitor Cc, in order to reduce an amplitude of the differential input signal, and the reduced differential input signal is received and the first time of comparison is completed by using the comparator, to obtain polarity of the differential input signal, and output a most significant bit of digital code. In this case, a mathematical expression of the differential input signals VP and VN of the comparator is VP−VN=(Cc/(C(n−2)+C(n−3)+ . . . +C3+C2+Cc+CRDAC)) (VIN−VIP). This is equivalent to that the differential input signal (VIN−VIP) is multiplied by a very small coefficient and then transferred to an input terminal of the comparator. In this way, the amplitude of the differential input signal can be greater than twice a supply-ground voltage difference of the comparator. Therefore, the amplitude of the differential input signal is increased to a largest degree without affecting reliability of the comparator, thereby increasing a signal-to-noise ratio. In addition, a noise requirement on the comparator is not increased.

Figure 8:
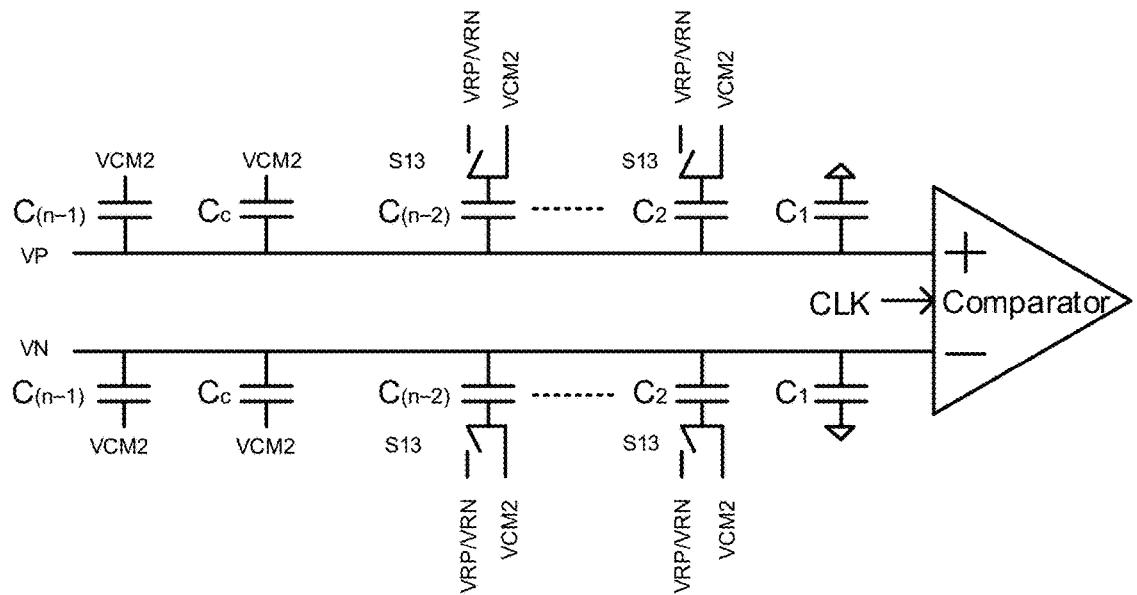
FIG. 8 is an equivalent schematic diagram after the first time of comparison is completed according to an embodiment of the present disclosure.
Figure 9:
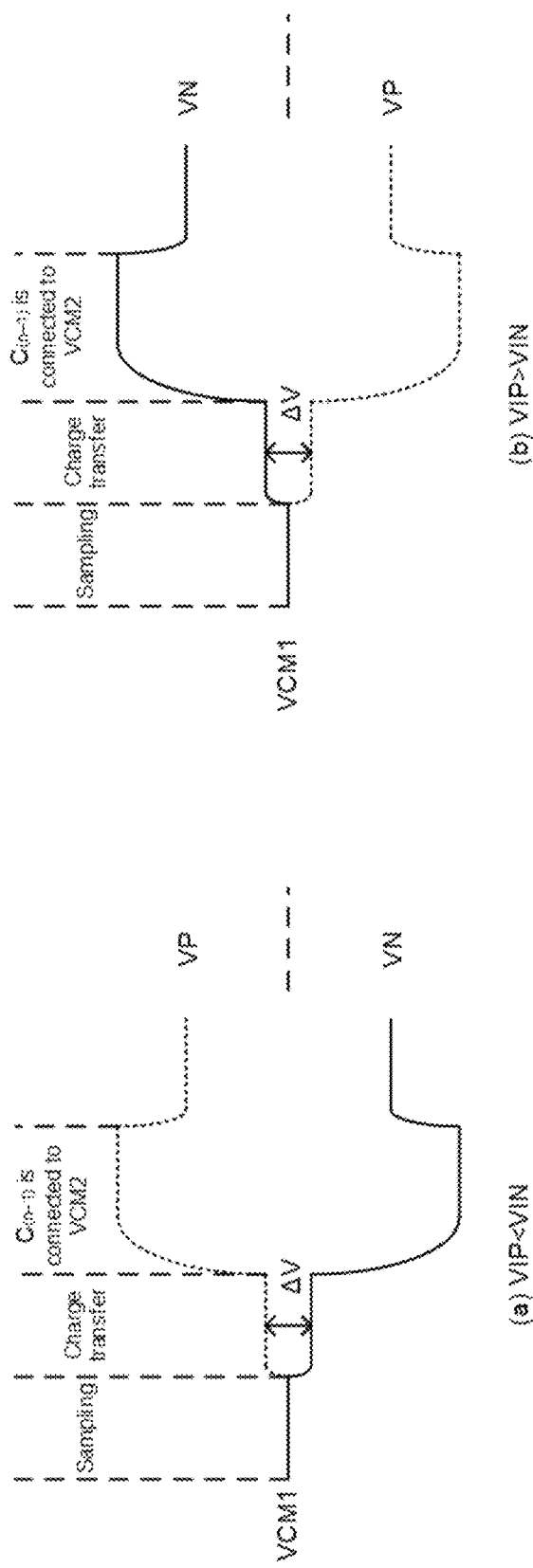
FIG. 9 is a schematic diagram of transient waveforms of VP and VN according to an embodiment of the present disclosure.

Referring to FIG. 8 and FIG. 9, as shown in FIG. 8, after the first time of comparison ends, the fifth switch S10 and the sixth switch S11 are turned on, the first switch array S12 is controlled, so that the second plate of the mth weighted capacitor in the capacitor array is connected to the second common-mode voltage VCM2, the differential input signal stored on the first weighted capacitor C(n−1) and the differential input signal stored on the charge transfer capacitor Cc are imported, the second switch array S13 is controlled by using the logic control module, so that n−3 other weighted capacitors and the redundant-bit capacitor array are cumulatively added to be imported into the reference voltage, so as to perform successive approximation conversion, and after n−3 times of comparison, n−3 bits of output codes of the successive approximation register analog-to-digital converter are successively obtained, to complete a comparison process. FIG. 9 is a schematic diagram of successive approximation waveforms of the differential input signals VP and VN of the comparator. When the converter in a sampling state, the differential input signals VP and the VN of the comparator are both equal to VCM1. It may be learned from VP−VN=(Cc/(C(n−2)+C(n−3)+ . . . +C3+C2+Cc+CRDAC)) (VIN−VIP) that, after Cc transfers the sampled charge, when VIP is less than VIN, (a) in FIG. 9 is a schematic diagram of successive approximation of the differential input signals VP and VN of the comparator; and when VIP is greater than VIN, (b) in FIG. 9 is a schematic diagram of successive approximation of the differential input signals VP and VN of the comparator. It may be learned from FIG. 9 that the foregoing successive approximation produces an error of 2ΔV. Therefore, in a subsequent successive approximation process, a redundant-bit capacitor array RDAC may be added to correct the foregoing error.

Figure 10:
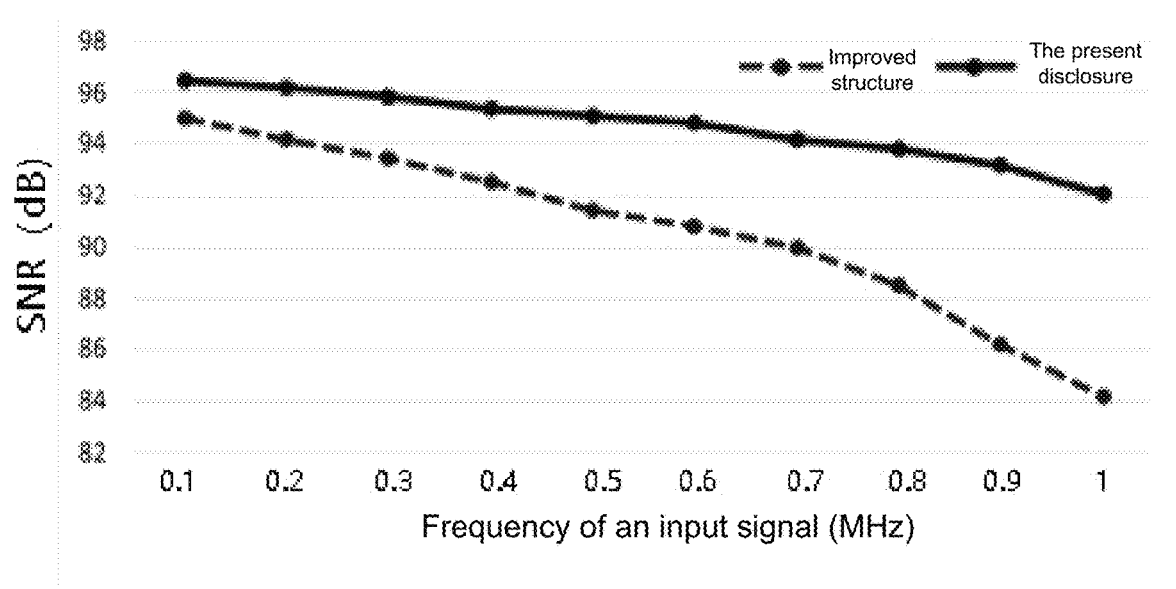
FIG. 10 is a diagram of comparison between SNRs of two structures when a frequency of an input signal changes according to an embodiment of the present disclosure.
Figure 11:
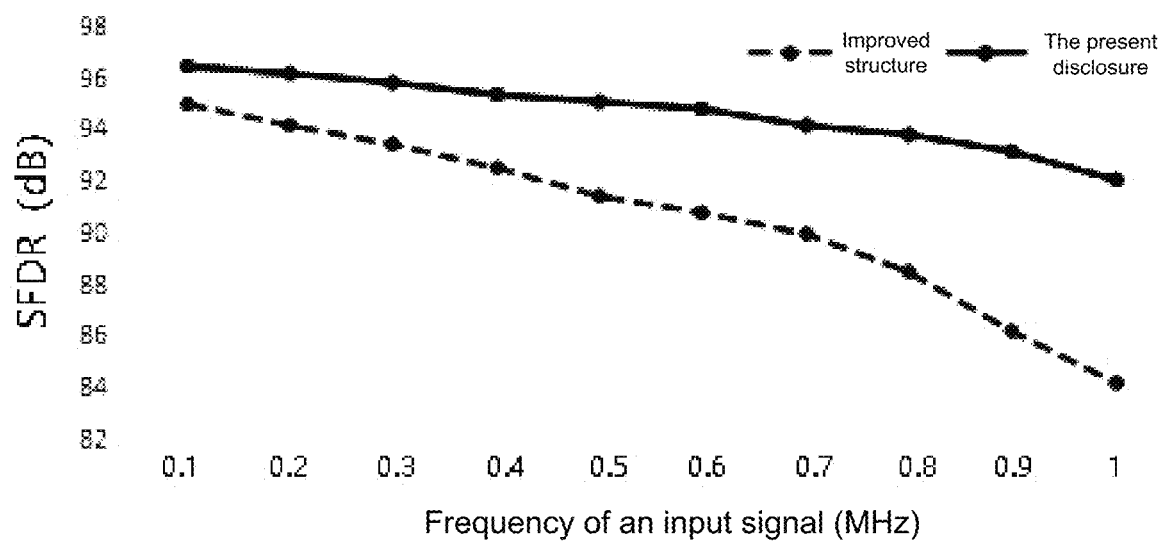
FIG. 11 is a diagram of comparison between SFDRs of two structures when a frequency of an input signal changes according to an embodiment of the present disclosure.

Referring to FIG. 10 and FIG. 11, in a specific embodiment, in a 180 nm CMOS process, an 18-bit 2 MHz SAR ADC is designed separately by using the improved-structure SAR ADC shown in FIG. 2 and the SAR ADC structure shown in FIG. 4 of the present disclosure. A supply voltage is 1.8 V, and a sampling frequency is 2 MHz. An amplitude of the differential input signal of the improved-structure SAR ADC shown in FIG. 2 is 3.6 V, and an amplitude of the differential input signal of the SAR ADC structure shown in the present disclosure is 7.2 V. At the sampling frequency of 2 MHz, FIG. 10 and FIG. 11 are respectively diagrams of comparison between simulation results of signal-to-noise ratios (SNR) and spurious-free dynamic ranges (SFDR) of the improved-structure SAR ADC shown in FIG. 2 and the SAR ADC structure shown in the present disclosure. It may be learned from the foregoing simulation results that, based on the high-precision SAR ADC sampling technology proposed in the present disclosure, precision of the SAR ADC can be significantly improved. As the frequency of the input signal increases, performance advantages of the structure shown in the present disclosure are more obvious.

Therefore, according to the successive approximation register analog-to-digital converter, the charge transfer capacitor is introduced, to substantially reduce the differential input signal. During the first time of comparison, polarity of the differential input signal is directly compared, so that an amplitude of the differential input signal can be greater than twice a supply-ground voltage difference of the comparator. Therefore, a noise requirement of the comparator is reduced without affecting reliability of the comparator, thereby increasing a signal-to-noise ratio of the successive approximation register analog-to-digital converter. Sampling is performed by using the first weighted capacitor and the charge transfer capacitor, so that the capacitor array can approximate to a single-capacitor sampling network, thereby eliminating a problem of bandwidth mismatch, in the sampling network, caused by a plurality of capacitors and a plurality of sampling paths in a conventional-structure successive approximation register analog-to-digital converter. Therefore, sampling precision of the successive approximation register analog-to-digital converter is significantly improved, so that performance of the entire successive approximation register analog-to-digital converter is significantly improved. The redundant-bit capacitor array RDAC is introduced, so that the error generated when the second plates of the charge transfer Cc and C(n−1) are connected to VCM2 is corrected, thereby ensuring precision of the entire successive approximation register analog-to-digital converter in the successive approximation process.

The present disclosure further provides an electronic device, and the electronic device includes the foregoing successive approximation register analog-to-digital converter.

Based on a same invention concept as the foregoing successive approximation register analog-to-digital converter, correspondingly, an embodiment further provides a comparison method for a successive approximation register analog-to-digital converter. In this embodiment, the method is implemented on the successive approximation register analog-to-digital converter described in any one of the foregoing embodiments. For specific functions and technical effects, refer to the foregoing embodiments. Details are not described herein again.

In an embodiment, the comparison method for a successive approximation register analog-to-digital converter includes: providing a successive approximation register analog-to-digital converter, where the successive approximation register analog-to-digital converter includes a capacitor array and a comparator, the capacitor array includes at least n−1 weighted capacitors and a charge transfer capacitor, n is an integer greater than or equal to 3, the n−1 weighted capacitors are successively arranged in descending order of capacitance, the first weighted capacitor has largest capacitance, and the last weighted capacitor has smallest capacitance; sampling an differential input signal by using the first weighted capacitor and the charge transfer capacitor; importing the differential input signal stored on the charge transfer capacitor, where the differential input signal is transferred and redistributed on the charge transfer capacitor and n−2 other weighted capacitors than the first weighted capacitor, to form a first differential signal, and receiving the first differential signal and completing the first time of comparison by using the comparator, to obtain polarity of the differential input signal, and output a most significant bit of digital code; and importing the differential input signal stored on the first weighted capacitor and the differential input signal stored on the charge transfer capacitor, importing a reference voltage by using the second to jth weighted capacitors, where the differential input signal and the reference voltage are transferred and redistributed on the capacitor array to form a jth differential signal, and receiving the jth differential signal and completing a jth time of comparison by using the comparator, to output a corresponding digital code, where j is an integer from 2 to n−2. In exemplary embodiments, capacitance of the charge transfer capacitor is less than capacitance of the last weighted capacitor. In exemplary embodiments, the capacitor array further includes a redundant-bit capacitor array, and the comparison method for a successive approximation register analog-to-digital converter further includes: in a jth comparison process, introducing a reference voltage by using the redundant-bit capacitor array, to correct the jth differential signal.

In conclusion, according to the successive approximation register analog-to-digital converter in the present disclosure, the charge transfer capacitor is introduced, to substantially reduce the differential input signal. During the first time of comparison, polarity of the differential input signal is directly compared, so that an amplitude of the differential input signal can be greater than twice a supply-ground voltage difference of the comparator. Therefore, a noise requirement of the comparator is reduced without affecting reliability of the comparator, thereby increasing a signal-to-noise ratio of the successive approximation register analog-to-digital converter. Sampling is performed by using the first weighted capacitor and the charge transfer capacitor, so that the capacitor array can approximate to a single-capacitor sampling network, thereby eliminating a problem of bandwidth mismatch, in the sampling network, caused by a plurality of capacitors and a plurality of sampling paths in a conventional-structure successive approximation register analog-to-digital converter. Therefore, sampling precision of the successive approximation register analog-to-digital converter is significantly improved, so that performance of the entire successive approximation register analog-to-digital converter is significantly improved. Therefore, the present disclosure effectively overcomes various disadvantages in the conventional technology and has high industrial utilization value.

The foregoing embodiments merely illustrate principles and effects of the present disclosure, but are not intended to limit the present disclosure. Any person skilled in the art may modify or alter the foregoing embodiments without departing from the scope of the present disclosure. Therefore, all equivalent modifications or alterations completed by a person of ordinary skill in the art without departing from the technical ideas disclosed in the present disclosure shall still be covered by the claims of the present disclosure.

What is claimed is:

1. A successive approximation register analog-to-digital converter, comprising:
   a comparator;
   a capacitor array, comprising a first capacitor array and a second capacitor array, wherein the first capacitor array and the second capacitor array each comprise n−1 weighted capacitors and a charge transfer capacitor, a first plate of the first capacitor array is connected to an in-phase input terminal of the comparator, a first plate of the second capacitor array is connected to an inverting input terminal of the comparator, n is an integer greater than or equal to 3, the n−1 weighted capacitors are successively arranged in descending order of capacitance, a first weighted capacitor has largest capacitance, and a last weighted capacitor has smallest capacitance;

a switch, comprising a first channel switch, a second channel switch, a third channel switch, a first switch, a second switch, a third switch, a fourth switch, a fifth switch, a sixth switch, a first switch array, and a second switch array, wherein a first common-mode voltage is connected to the in-phase input terminal of the comparator after passing through the first channel switch connected in series, the first common-mode voltage is connected to the inverting input terminal of the comparator after passing through the second channel switch connected in series, the third channel switch is connected in series between the in-phase input terminal of the comparator and the inverting input terminal of the comparator, a second plate of the first weighted capacitor in the first capacitor array is further connected to a first output terminal of an differential input signal via the first switch connected in series, a second plate of the first weighted capacitor in the second capacitor array is further connected to a second output terminal of the differential input signal via the second switch connected in series, a second plate of the charge transfer capacitor in the first capacitor array is further connected to the first output terminal of the differential input signal via the third switch connected in series, a second plate of the charge transfer capacitor in the second capacitor array is further connected to the second output terminal of the differential input signal via the fourth switch connected in series, the second plate of the first weighted capacitor in the capacitor array is connected to a second common-mode voltage by using the fifth switch, the second plate of the charge transfer capacitor in the capacitor array is connected to the second common-mode voltage by using the sixth switch, a second plate of the last weighted capacitor in the capacitor array is grounded, a second plate of an mth weighted capacitor in the capacitor array is connected to the second common-mode voltage by using a corresponding switch in the first switch array, the second plate of the mth weighted capacitor in the capacitor array is further connected to a reference voltage by using a corresponding switch in the second switch array, and m=2, 3, . . . , n−2; and a logic control module, wherein an input terminal of the logic control module is connected to an output terminal of the comparator, an output terminal of the logic control module is connected to the second switch array, each switch in the second switch array is controlled based on an output signal of the comparator, so as to perform successive approximation conversion, and successive approximation comparison is performed based on the comparator, so as to implement analog-to-digital conversion.

2. The successive approximation register analog-to-digital converter according to claim 1, wherein capacitance of the charge transfer capacitor is less than capacitance of the last weighted capacitor.

3. The successive approximation register analog-to-digital converter according to claim 2, wherein the capacitor array further comprises:

a redundant-bit capacitor array, wherein a second plate of the redundant-bit capacitor array in the capacitor array is connected to the second common-mode voltage by using a corresponding switch in the first switch array, and the second plate of the redundant-bit capacitor array in the capacitor array is further connected to the reference voltage by using a corresponding switch in the second switch array.

4. The successive approximation register analog-to-digital converter according to claim 1, wherein
weight values of the weighted capacitors from a most significant bit to a least significant bit are respectively $2^{n-2}C, 2^{n-3}C, \ldots, 2C, C$.

5. The successive approximation register analog-to-digital converter according to claim 1, wherein
the first channel switch, the second channel switch, the third channel switch, the first switch, the second switch, the third switch, and the fourth switch are turned on in a sampling state, the first switch array is controlled to connect the second plate of the mth weighted capacitor in the capacitor array to the second common-mode voltage, and the first weighted capacitor and the charge transfer capacitor are configured to sample the differential input signal.

6. The successive approximation register analog-to-digital converter according to claim 5, wherein
after sampling ends, the first weighted capacitor is controlled to be in a disconnected state, the sixth switch is turned on, the first switch array is controlled to connect the second plate of the mth weighted capacitor in the capacitor array to the second common-mode voltage, the differential input signal stored on the charge transfer capacitor is transferred and redistributed on n−2 other weighted capacitors and the charge transfer capacitor, to reduce an amplitude of the differential input signal, and the reduced differential input signal is received and a first time of comparison is completed by using the comparator, to obtain polarity of the differential input signal, and output a most significant bit of digital code.

7. The successive approximation register analog-to-digital converter according to claim 6, wherein
after the first time of comparison ends, the fifth switch and the sixth switch are turned on, the first switch array is controlled to connect the second plate of the mth weighted capacitor in the capacitor array to the second common-mode voltage, the differential input signal stored on the first weighted capacitor and the differential input signal stored on the charge transfer capacitor are imported, the second switch array is controlled by using the logic control module, so that n−3 other weighted capacitors are successively accumulated and imported to the reference voltage, so as to perform successive approximation conversion, and after n−3 times of comparison, n−3 bits of output codes of the successive approximation register analog-to-digital converter are successively obtained, to complete a comparison process.

8. A comparison method for a successive approximation register analog-to-digital converter, comprising:
providing a successive approximation register analog-to-digital converter, wherein the successive approximation register analog-to-digital converter comprises a capacitor array and a comparator, the capacitor array comprises at least n−1 weighted capacitors and a charge transfer capacitor, n is an integer greater than or equal to 3, the n−1 weighted capacitors are successively arranged in descending order of capacitance, a first weighted capacitor has largest capacitance, and a last weighted capacitor has smallest capacitance;
sampling an differential input signal by using the first weighted capacitor and the charge transfer capacitor;
importing the differential input signal stored on the charge transfer capacitor, wherein the differential input signal is transferred and redistributed on the charge transfer capacitor and n−2 other weighted capacitors than the first weighted capacitor, to form a first differential signal, and receiving the first differential signal and completing a first time of comparison by using the comparator, to obtain polarity of the differential input signal, and output a most significant bit of digital code; and importing the differential input signal stored on the first weighted capacitor and the differential input signal stored on the charge transfer capacitor, importing a reference voltage by using the second to jth weighted capacitors, wherein the differential input signal and the reference voltage are transferred and redistributed on the capacitor array to form a jth differential signal, and receiving the jth differential signal and completing a jth time of comparison by using the comparator, to output a corresponding digital code, wherein j is an integer from 2 to n−2.

9. The comparison method for a successive approximation register analog-to-digital converter according to claim 8, wherein capacitance of the charge transfer capacitor is less than capacitance of the last weighted capacitor.

10. The comparison method for a successive approximation register analog-to-digital converter according to claim 9, wherein the capacitor array further comprises a redundant-bit capacitor array, and the comparison method for a successive approximation register analog-to-digital converter further comprises:

in a jth comparison process, introducing a reference voltage by using the redundant-bit capacitor array, to correct the jth differential signal.

* * * * *